United States Patent
Hyman et al.

(10) Patent No.: US 11,552,644 B2
(45) Date of Patent: Jan. 10, 2023

(54) FAST FREQUENCY HOPPING OF MODULATED SIGNALS

(71) Applicant: IXI Technology Holdings, Inc., Yorba Linda, CA (US)

(72) Inventors: Daniel Hyman, Long Beach, CA (US); Jeffrey Norris, Lake Forest, CA (US); Michael Dekoker, Huntington Beach, CA (US); Anthony Aquino, Brea, CA (US)

(73) Assignee: IXI TECHNOLOGY HOLDINGS, INC., Yorba Linda, CA (US)

( * ) Notice: Subject to any disclaimer, the term of this patent is extended or adjusted under 35 U.S.C. 154(b) by 345 days.

(21) Appl. No.: 16/746,937

(22) Filed: Jan. 19, 2020

(65) Prior Publication Data

US 2022/0399987 A1    Dec. 15, 2022

(51) Int. Cl.
| | | |
|---|---|---|
| *H03L 7/099* | (2006.01) | |
| *H03F 3/45* | (2006.01) | |
| *H03C 3/09* | (2006.01) | |
| *H04B 1/7136* | (2011.01) | |

(52) U.S. Cl.
CPC ........... *H03L 7/099* (2013.01); *H03C 3/0908* (2013.01); *H03F 3/45475* (2013.01); *H04B 1/7136* (2013.01)

(58) Field of Classification Search
CPC ......... H03L 7/099; H03L 7/18; H03L 7/0805; H03L 7/104; H03L 7/08; H03L 7/0802; H03L 7/10; H03L 7/101; H03L 7/16; H03L 7/06; H03L 7/00
See application file for complete search history.

(56) References Cited

U.S. PATENT DOCUMENTS

| | | | |
|---|---|---|---|
| 4,792,768 A | 12/1988 | Fried et al. | |
| 5,079,522 A | 1/1992 | Owen et al. | |
| 6,034,566 A * | 3/2000 | Ohe ........................ | H03F 3/195 |
| | | | 330/69 |
| 6,424,229 B1 | 7/2002 | Justice et al. | |
| 6,490,441 B1 * | 12/2002 | Saito ....................... | H03J 1/005 |
| | | | 455/318 |
| 10,234,542 B2 * | 3/2019 | Subburaj ............... | G01S 13/931 |
| 2005/0036566 A1 | 2/2005 | Eikenbroek et al. | |
| 2006/0268182 A1 | 11/2006 | Shields | |
| 2010/0093299 A1 | 4/2010 | Pinel et al. | |

* cited by examiner

*Primary Examiner* — Diana J. Cheng
(74) *Attorney, Agent, or Firm* — The Watson IP Group, PLC; Jovan N. Jovanovic (57) ABSTRACT

An apparatus is comprised of a processor, a fast-locking Phase-Locked Loop Waveform Generator (PLLWG), an amplifier circuit, and a voltage controlled oscillator (VCO). The processor generates data program signals to program the PLLWG and generates a trigger command signal instructing the PLLWG to generate an analog tuning signal. The PLLWG, coupled to the processor, generates the analog tuning signal based on the trigger command signal. The amplifier circuit, coupled to the PLLWG, receives the analog tuning signal, amplify the analog tuning signal, and generates a control voltage. The VCO, coupled to the amplifier circuit, receives the control voltage and amplifies the control voltage to generate an amplified Radio Frequency (RF) channel frequency signal.

16 Claims, 3 Drawing Sheets

FAST FREQUENCY HOPPING OF MODULATED SIGNALS

CROSS-REFERENCE TO RELATED APPLICATION

NA

BACKGROUND OF THE DISCLOSURE

1. Field of the Disclosure

The disclosure relates in general to modulated signals, and more particularly, to fast frequency hopping of modulated signals. Such modulation is not limited to countering drones, however, such modulation is particularly useful for stopping and preventing unwanted drone activity.

2. Background Art

A typical high-data-rate communication system is limited in speed with which it may be reconfigured from one channel with one waveform to another channel of the same or different waveform. Digital modulation techniques can change a modulation technique of a center frequency (e.g., a particular channel) nearly instantaneously (e.g., nanoseconds to tens of nanoseconds), but the change of the center frequency is comparably slow (tens to hundreds of microseconds). Direct digital synthesis techniques can change both center frequency and modulation nearly instantaneously but require a high-speed digital-to-analog converter (DAC) capable of generating the center frequency directly. Such systems have high speed and many options for waveforms and/or modes of operation, but are significantly more expensive and consume greater power than conventional heterodyne architectures.

Typical communication systems, including most military systems, use channel-hopping speeds of tens of pec to tens of msec. Only very specific communications, communication emulation/disruption, and electronic warfare systems benefit from faster μsec or sub-μsec channel hopping. No commercial Phase-Locked Loop (PLL) controller for any separate or integrated Voltage-Controlled Oscillator (VCO) product or combination of products is fast enough to meet this specific speed.

SUMMARY OF THE DISCLOSURE

The disclosure is directed to an apparatus that is comprised of a processor, a Phase-Locked Loop Waveform Generator (PLLWG), an amplifier circuit, and a VCO. The processor generates data program signals to program the PLLWG and generates a trigger command signal instructing the PLLWG to generate an analog tuning signal. The PLLWG, coupled to the processor, generates the analog tuning signal based on the trigger command signal. The amplifier circuit, coupled to the PLLWG, receives the analog tuning signal, amplifies the analog tuning signal, and generates a control voltage. The VCO, coupled to the amplifier circuit, receives the control voltage and amplifies the control voltage to generate an amplified Radio Frequency (RF) channel frequency signal.

In some configurations, the amplifier circuit is comprised of an amplifier, a first voltage divider resistor, and a second voltage divider resistor. The first voltage divider resistor and the second voltage divider resistor create an amplifier voltage reference for input to the amplifier.

In some configurations, the apparatus is further comprised of a conditioning circuit coupled to both the PLLWG and the amplifier circuit. The conditioning circuit is comprised of a capacitor and a resistor, one side of the capacitor being coupled to one side of the resistor and the PLLWG, and the other side of the capacitor being coupled to electrical ground and the other side of the resistor being coupled to the amplifier circuit.

In some configurations, the apparatus is further comprised of a Digital-to-Analog Converter (DAC) and an upconverting Quadrature Modulation (QM) mixer. The processor further generates a data command which instructs the DAC to generate an in-phase modulation signal and a QM signal. The upconverting QM mixer receives the in-phase modulation signal, the QM signal, and the amplified RF channel frequency signal, and generates a modulated radio frequency output based on the in-phase modulation signal, the QM signal, and the amplified RF channel frequency signal.

In some configurations, the PLLWG is comprised of a Phase Frequency Detector (PFD) circuit that measures a feedback of the VCO to determine whether the analog tuning signal needs to be one of raised and lowered, and includes an estimate of by how much to one of raise and lower the analog tuning signal.

In some configurations, the timing resource is comprised of first and second Asynchronous Clock Generators (ACGs). The first ACG generates a processor timing signal for the processor and the second ACG generates a PLLWG timing signal for the PLLWG.

In some configurations, the amplifier circuit includes a buffering integrated amplifier and the apparatus further comprising a tuning feedback circuit feeding-back the control voltage to the buffering integrated amplifier.

In some configurations, the processor is one of an NXP LPC43S50 with a system clock of 204 MHz and capable of synchronous Serial General Purpose Input Output (SGPIO) bit-shifting speeds of up to 102 MHz, and a Field-Programmable Gate Array (FPGA), and System-On-a-Chip (SOC).

In some configurations, the apparatus further comprises an RF power splitter that transforms the amplified RF channel frequency signal into two RF signals each having approximately half of a power of the amplified RF channel frequency signal.

In some configurations, the VCO includes an oscillator element and a VCO amplifier. The oscillator element receives the control voltage and generates an initial RF channel frequency signal of a frequency determined by a voltage level of the control voltage. The VCO amplifier amplifies the initial RF channel frequency signal and outputs the amplified RF channel frequency signal.

The disclosure is also directed to a method that comprises generating data program signals to program a PLLWG and generating a trigger command signal instructing the PLLWG to generate an analog tuning signal, the generating of the data communication signals and the generating of the trigger command signal being performed by a processor. The method further comprises generating, by the PLLWG coupled to the processor, the analog tuning signal based on the trigger command signal. The method yet further comprises receiving the analog tuning signal, amplifying the analog tuning signal, and generating a control voltage, the receiving of the analog tuning signal, the amplifying of the analog tuning signal, and the generating the control voltage being performed by an amplifier circuit. The method even yet further comprises receiving the control voltage and amplifying the control voltage to generate an amplified Radio Frequency (RF) channel frequency signal, the receiving of the control voltage and the amplifying of the control voltage being performed by a VCO coupled to the amplifier circuit.

In some configurations, the amplifier circuit is comprised of an amplifier, a first voltage divider resistor, and a second voltage divider resistor, the method further comprising generating, by the first voltage divider resistor and the second voltage divider resistor, an amplifier voltage reference for input to the amplifier.

In some configurations, the method further comprises coupling a conditioning circuit to both the PLLWG and the amplifier circuit. The conditioning circuit is comprised of a capacitor and a resistor, one side of the capacitor being coupled to one side of the resistor and the PLLWG, and the other side of the capacitor being coupled to electrical ground and the other side of the resistor being coupled to the amplifier circuit.

In some configurations, the method further comprises generating, by the processor, a data command which instructs a DAC to generate an in-phase modulation signal and a QM signal. The method yet further comprises receiving, by an upconverting QM mixer, the in-phase modulation signal, the QM signal, and the amplified RF channel frequency signal. The method even yet further comprises generating, by the upconverting QM mixer, a modulated radio frequency output based on in-phase modulation signal, the QM signal, and the amplified RF channel frequency signal.

In some configurations, the PLLWG is comprised of a PFD circuit, the method further comprising measuring, by the PFD circuit, a feedback of the VCO to determine whether the analog tuning signal needs to be one of raised and lowered, and includes an estimate of by how much to one of raise and lower the analog tuning signal.

In some configurations, the timing resource is comprised of first and second ACGs, the method further comprising generating, by the first ACG, a processor timing signal for the processor, and generating, by the second ACG, a PLLWG timing signal for the PLLWG.

In some configurations, the amplifier circuit includes a buffering integrated amplifier, the method further comprising feeding back, by a tuning feedback circuit, the control voltage to the buffering integrated amplifier.

In some configurations, the processor of the method is one of an NXP LPC43S50 with a system clock of 204 MHz and capable of synchronous SGPIO bit-shifting speeds of up to 102 MHz, and a Field-Programmable Gate Array (FPGA), and System-On-a-Chip (SOC).

In some configurations, the method further comprises transforming, by an RF power splitter, the amplified RF channel frequency signal into two RF signals each having approximately half of a power of the amplified RF channel frequency signal.

In some configurations, the VCO includes an oscillator element and a VCO amplifier, the method further comprising receiving, by the oscillator element, the control voltage and generating an initial RF channel frequency signal of a frequency determined by a voltage level of the control voltage and amplifying, by the VCO amplifier, the initial RF channel frequency and output the amplified RF channel frequency signal.

BRIEF DESCRIPTION OF THE DRAWINGS

The disclosure will now be described with reference to the drawings wherein.

DETAILED DESCRIPTION OF THE DISCLOSURE

While this disclosure is susceptible of embodiment(s) in many different forms, there is shown in the drawings and described herein in detail a specific embodiment(s) with the understanding that the present disclosure is to be considered as an exemplification and is not intended to be limited to the embodiment(s) illustrated.

It will be understood that like or analogous elements and/or components, referred to herein, may be identified throughout the drawings by like reference characters. In addition, it will be understood that the drawings are merely schematic representations of the invention, and some of the components may have been distorted from actual scale for purposes of pictorial clarity.

Figure 1:
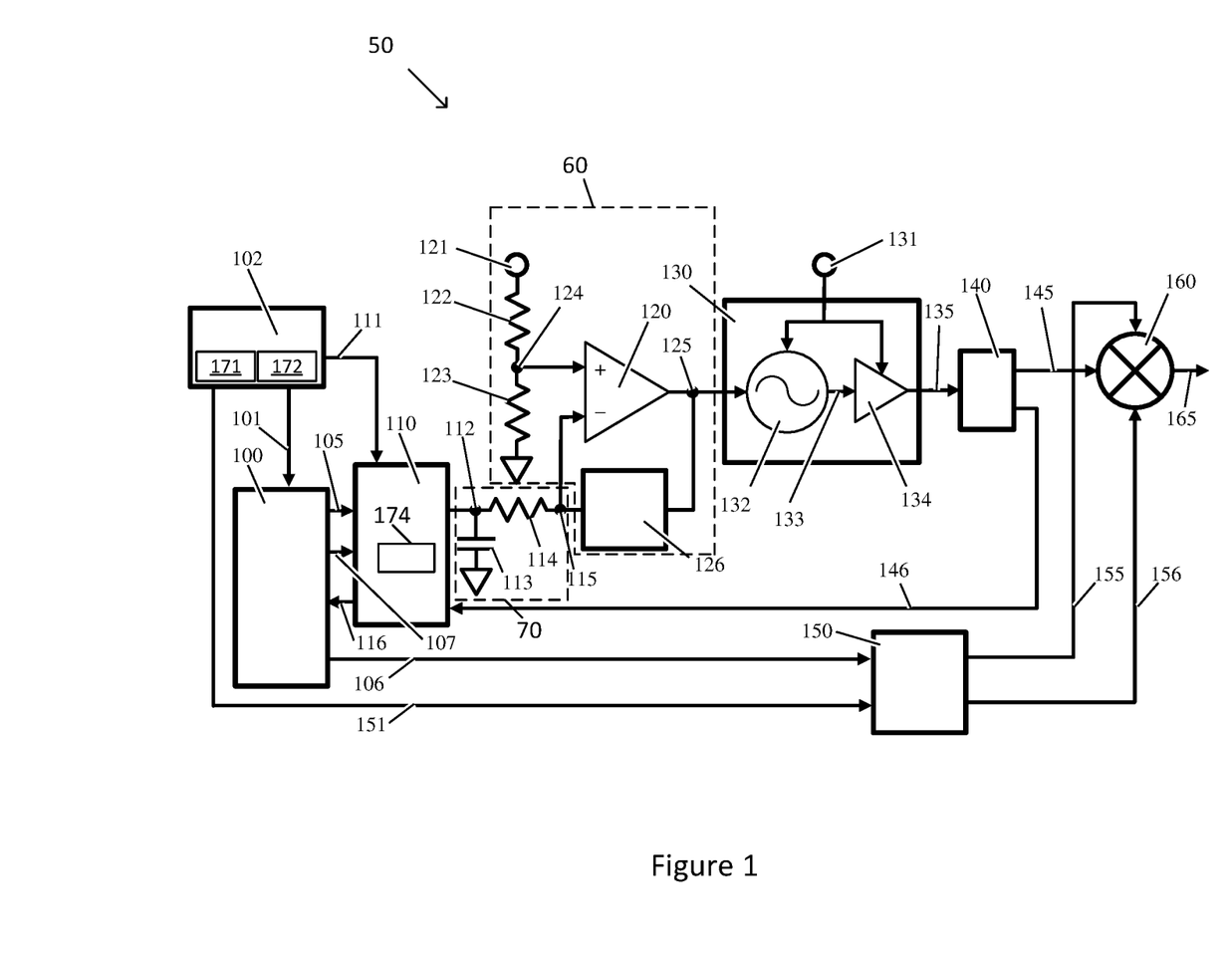
FIG. 1 illustrates an example apparatus to generate an amplified radio frequency channel frequency signal, in accordance with at least one embodiment disclosed herein.

Referring now to the drawings and in particular to FIG. 1, an embodiment is disclosed that includes an apparatus 50 illustrated as including a plurality of components, such as a timing resource 102 that is coupled to a processor, such as a microcontroller unit (MCU) 100, a fast-locking PLLWG 110, and a DAC, such as a QM DAC 150. The timing resource 102 generates at least three timing signals, an MCU timing signal 101, a PLLWG timing signal 111, and a QM timing signal 151, which are received by the MCU 100, the PLLWG 110, and the QM DAC 150, respectively. The MCU timing signal 101 functions as a form of clock that ensures timing of processor functions, data, and waveform generator are synchronized to the degree necessary. The MCU 100 generates control commands for the apparatus 50. In at least one embodiment, the MCU 100 is an NXP LPC43S50 with a system clock of 204 MHz and capable of synchronous SGPIO bit-shifting speeds of up to 102 MHz. In other alternative embodiments, one or more of any number of available microprocessor components, Field-Programmable Gate Arrays (FPGAs), or Systems-On-a-Chip (SOCs) can perform the role of the MCU 100.

In at least one embodiment, the timing resource 102 is comprised of two ACGs, such as ACG 171 and ACG 172, the ACG 171 generating the MCU timing signal 101 and the QM timing signal 151 for the QM DAC 150, and the ACG 172 generating the PLLWG timing signal 111 for the PLLWG 110. It at least one other embodiment, these clock generators may be synchronous, driven by a single master oscillating source and buffered and/or distributed to multiple circuits. In at least one embodiment, these clock generators may be buffered and distributed to multiple MCUs (not shown), PLLWGs (not shown), or both (not shown), such that a small number of master clocks can provide partially, essentially, or synchronous timing to a plurality of circuits (not shown) in a multi-band system (not shown).

The MCU 100 also is coupled to the PLLWG 110. The PLLWG 110 generates an analog tuning signal that will be filtered and amplified by an amplifier, such as an amplifier 120 which in at least one embodiment is a buffering integrated amplifier, and subsequently used for tuning an output frequency of an oscillator, such as a RF VCO 130. The RF VCO 130 generates an RF signal having an output frequency and other electrical characteristics based on the tuning voltage presented at its input, such as a precise control voltage signal 125. The RF VCO 130 is coupled to an RF power splitter 140. This RF signal output frequency is used as the center frequency of a modulated transmission. The RF power splitter 140 is further coupled to the PLLWG 110 and an upconverting QM mixer 160 that is coupled to the QM DAC 150. The QM DAC 150 generates modulation signals that are sent to the upconverting QM mixer 160. The upconverting QM mixer 160 modulates the center frequency signal into a modulated waveform, such as a modulated RF output signal 165, containing the data provided by the QM DAC 150.

The MCU 100 generates the program data signals 107 which are used to program the PLLWG 110 with ramp information and operating mode, as well generating a trigger command signal 105 which instructs the PLLWG 110 to generate and output a analog tuning signal 112, such as based on the ramp information and operating mode. The MCU 100 further generates a data command, such as a QM trigger signal 106 which instructs the QM DAC 150 to generate an in-phase modulation signal 155 and a QM signal 156 that is 90° out of phase with the in-phase modulation signal 155. When the MCU 100 is prepared to begin transmitting modulated outputs, the MCU 100 sends the QM trigger signal 106 to the QM DAC 150, which responds by outputting the in-phase modulation signal 155 and the QM signal 156. These in-phase and quadrature-phase signals are sent to the QM mixer 160. In the example of FIG. 1, the MCU 100 is a separate component from the QM DAC 150. In at least one other embodiment, the MCU 100 can incorporate an integrated DAC (not shown), in that embodiment(s) the in-phase modulation signal 155 and the QM signal 156 are generated inside the MCU 100 using the processor's own timing reference or externally provided reference. In at least one embodiment, the MCU 100 can pre-program the QM DAC 150, the QM DAC 150 pre-loaded with digitally defined amplitude data that it uses for its outputs. This data includes the voltage amplitude levels for two analog output signals, the in-phase modulation signal 155 and the QM signal 156.

In at least one embodiment, the MCU 100 can use high-speed or GPIO signal pins for the generation of modulation signals with an attendant reduction in complexity. In such embodiments, however, the amplitude and phase options for generating in-phase and modulated signals would be limited, resulting in comparatively crude modulation signals likely requiring additionally filtering and/or may be unsuitable for many applications. It is further contemplated that in another embodiment(s) of the presently discussed subject matter, the modulation signals could be provided by a digitally synthesized waveform generator (not shown), which would receive modulation and/or data program signals from its controlling microprocessor and generate its signals as a directly synthesized waveform instead of by a pre-constructed digital waveform sent to a DAC for analog conversion.

In at least one embodiment, the PLLWG 110 is an Analog Devices ADF4169 fractional-N frequency synthesizer and waveform generator used primarily in automotive, Frequency-Modulated Continuous-Wave (FMCW) radar systems, and test equipment. This integrated component is comprised of a low-noise digital PFD as the sensor for the phase-locked-loop function, charge pump for generating the analog tuning signal 112, and a programmable reference divider with sigma-delta 25-bit fractional interpolator for defining RF channel center frequencies and ramp characteristics. This component also has latch enable and trigger input pins permitting the start of a ramp cycle and the advancement of ramp steps, a function discussed in more detail with the description of FIG. 2.

The PLLWG 110 outputs the analog tuning signal 112 to a conditioning circuit 70. In at least one embodiment, the conditioning circuit 70 is a passive network comprising a tuning shunt capacitor 113, one side of which is coupled to electrical ground and the other side of which is coupled to the PLLWG 110, and a tuning series resistor 114, one side of which is coupled to the non-electrical ground side of the capacitor and the other side of which is coupled to a tuning feedback circuit 126 (discussed in more detail below), with the conditioned analog tuning signal 115 resulting and being sent into an amplifier circuit 60, specifically the amplifier 120 of the amplifier circuit 60, as a negative input. This input of conditioned analog tuning signal 115 forms part of the amplifier circuit 60 capable of providing a strong, stable, and the precise control voltage signal 125 at its output.

In at least one embodiment, the tuning shunt capacitor 113 is 12 pF and the tuning series resistor 114 is 220 Ohms. In other at least one embodiment, other circuit configurations and values for the conditioning circuit 70 can be used, including fixed, variable, or digitally selectable capacitors between 0.05 pF to 10 µF, fixed, variable, or digitally selectable resistors between 0.001 Ohm to 10 MOhm, and/or fixed, variable, or digitally selectable inductors between 0.1 nH to 100 pH. In other implementations according to the presently described embodiment(s) can incorporate references to RF ground, analog ground, digital ground, or other voltage levels relative to one or more grounds.

The amplifier circuit 60 is further comprised of an amplifier voltage reference signal 124, a first voltage divider resistor 122, and a second voltage divider resistor 123, the first voltage divider resistor 122 and the second voltage divider resistor 123 together forming a voltage divider circuit. The first voltage divider resistor 122 and the second voltage divider resistor 123 create the amplifier voltage reference signal 124 for input to the amplifier 120. One side of the first voltage divider resistor 122 is coupled to an amplifier input voltage 121 and the other side of the first voltage divider resistor 122 is coupled to both the second voltage divider resistor 123 and the positive input of the amplifier 120. In at least one embodiment, the amplifier voltage reference signal 124 is a highly regulated and stable 3.00 V referenced to the analog ground shared by the RF VCO 1301. Furthermore, in at least one embodiment the first voltage divider resistor 122 and second voltage divider resistor 123 are each 47 kOhm with 0.1% tolerance, resulting in a carefully controlled amplifier voltage reference signal 124 value of 1.65V.

In at least one other embodiment, the amplifier voltage reference signal 124 will typically range from −5 V to +5 V, but can range from −100 V to +100 V, with a value and ground reference selected based on the specific configuration and implementation of operational amplifier circuitry utilized. In at least one other embodiment, the voltage divider circuit discussed above can use components ranging from 0 to 10 MOhm with tolerances between 0.001 and 20%, although values in the kOhm to tens of kOhm and tolerances between 0.05 and 1% are generally preferred for some embodiment(s) according to the presently described subject matter. It is further contemplated that additional resistive and/or reactive components may be used in a voltage reference circuit to provide flat temperature characteristics, or varying temperature characteristics that compensate for the reference voltage and/or VCO temperature characteristics. It is noted that the voltage level of this reference voltage, as well as the precision value and temperature coefficient characteristics of the reference dividing circuit are each critical to control, as variance and/or instability will transition into variance and/or instability of the output of the amplifier 120, the precise control voltage signal 125. In at least one other embodiment, the amplifier circuit 60 can be configured with the analog tuning signal presented to the positive reference voltage terminal, and a reference voltage presented to the negative reference voltage terminal. Various configurations of active PLL filter circuitry are left to those skilled in the art to design, without departing from the spirit and scope of the disclosed embodiment(s).

The amplifier circuit 60 outputs the precise control voltage signal 125 as the primary output of this stage of the apparatus 60. The amplifier 120 is coupled to the tuning feedback circuit 126, with the precise control voltage signal 125 being fed back through the tuning feedback circuit 126 to reconnect with the analog tuning signal 115, as shown. In at least one embodiment, the tuning feedback circuit 126 is comprised of a parallel arrangement of a series capacitor of 8 µF parallel to a series capacitor of 180 µF and series resistor of 2,000 Ohms. In at least one other embodiment, the tuning feedback circuit 126 can include a feedback network containing reactive and/or resistive components having other values, such as fixed, variable, or digitally selectable capacitors between 0.05 µF to 10 µF, fixed, variable, or digitally selectable resistors between 0.001 Ohm to 10 MOhm, and/or fixed, variable, or digitally selectable inductors between 0.1 nH to 100 pH. It is further contemplated that the feedback networks in other embodiments can incorporate references to RF ground, analog ground, digital ground, or other voltage levels relative to one or more grounds.

In at least one embodiment, the precise control voltage signal 125 is filtered through a low pass filter (not shown) and presented as an input to the RF VCO 130 that is powered by a VCO input voltage 131. In at least one embodiment, this voltage reference is a highly regulated and stable 3.00 V referenced to the analog ground shared by the amplifier 120. In at least one embodiment, this voltage reference can range from −100 V to +100 V, with a value and ground reference selected based on the specific configuration and implementation of operational amplifier circuitry. In a similar manner as with the amplifier input voltage 121, the voltage level of this reference voltage is critical to control, as variance and/or instability will transition into variance and/or instability of the RF VCO 130.

In at least one embodiment, the RF VCO 130 is a monolithic microwave integrated circuit that includes a buffering amplifier, which is a typical configuration for VCO products used by those skilled in the art. An example of such a device is an Analog Devices HMC385LP4, which tunes from 2.25 to 2.5 GHz based on the input tuning voltage range of 0 to 10V and with moderate output power of a few dBm having low phase noise of −115 dBc/Hz. Such a device is typical for the communications industry for use in wireless infrastructure, industrial controls, test equipment, and military applications. The output frequency can change at a high slew rate (~400 MHz per microsecond) but only when presented with a strongly driven tuning signal. The function of the buffering amplifier 120 therefore necessarily includes the capability of driving the RF VCO 130 at a slew rate required by a particular application in which the apparatus 50 is utilized.

The RF VCO 130 receives the precise control voltage signal 125 from the amplifier 60, specifically an oscillator element 132 receives the precise control voltage signal 125 to generate an initial RF channel frequency signal 133 of a frequency determined by the voltage level of the precise control voltage signal 125 and the operating characteristics (voltage power level, temperature, etc.) of the analog RF VCO 130. The RF VCO 130 also includes a VCO amplifier 134 coupled to the oscillator element 132, the VCO amplifier 134 amplifying the initial RF channel frequency signal 133 and outputting an amplified RF channel frequency signal 135, the amplified RF channel frequency signal 135 being the output of the RF VCO 130. In at least one embodiment, the amplified RF channel frequency signal 135 ranges in frequency between 2400 MHz and 2500 MHz, with a power level varying between +1.5 dBm to +6 dBm. It is recognized that the channel frequency signal and/or power level of other embodiments of the presently described subject matter may be significantly higher or lower based on the characteristics of the particular VCO used.

The RF VCO 130 is further coupled to an RF power splitter 140, with the amplified RF channel frequency signal 135 being sent to the RF power splitter 140. The RF power splitter 140 transforms the amplified RF channel frequency signal 135 signal into two RF signals each having approximately half of a power of the amplified RF channel frequency signal 135, a pre-QM RF channel frequency signal 145 and a feedback RF channel frequency signal 146. The feedback RF channel frequency signal 146 is returned to the PLLWG 110 and measured by a PFD circuit 174 therein. This PFD circuit 174 detects if the output frequency is matched to the target output frequency target within the accuracy of characteristics and timing resource precision of the PFD circuitry 174. Operation of the PLL function on the feedback RF channel frequency signal 146 is well understood by those skilled in the art of RF oscillator design and is not repeated in detail here in the interest of brevity.

The PFD circuit's 174 output is measured to determine whether the analog tuning signal 112 needs to be raised or lowered and includes an estimate of by how much to one of raise and lower the analog tuning signal 112. When the feedback RF channel frequency signal 146 matches a target frequency, the PLLWG 110 maintains its output and the system is said to be "locked". Initial locking is achieved by matching frequency, then with additional time the PLLWG 110 can lock the phase state of that frequency output as well. In circuit configurations using typical integrated PLL and VCO components of the communications industry, this lock is achieved in a time period of between 10 µsec to 10,000 µsec. The example apparatus 50 shown in FIG. 1 locks frequency and phase in a time period of between 300 nsec to 3 µsec. Frequency lock can be achieved in as little as 100 nsec using a substantially similar configuration according to the presently described embodiment(s), and other component combinations can readily achieve a range of lock times between 50 nsec and 10 µsec dependent on the hardware, software, and operating conditions.

An additional aspect of embodiment(s) according to the presently described disclosure is that the PLLWG 110 is capable of not only PLL operation, but also of waveform generation. This specifically refers to the ability to pre-program the PLLWG 110 with a plurality of frequency targets in a specific order. In a typical application for PLLWG circuits in automotive FMCW radar, these pre-programmed frequency targets are arranged in a smooth triangle-shaped ramp or smooth sawtooth-shaped ramp. In a typical application for PLLWG circuits in test equipment, these pre-programmed frequency targets are arranged as a series of discrete steps that escalate monotonically from an initial lowest value to a final highest value. The increment between each step (e.g., how long each frequency step is maintained) is either a timed value or a triggered value, using an input signal to step from each frequency to the following frequency. Once the highest value is achieved, the typical PLLWG would be programmed to either stop transmission, restart the ramp (sawtooth type), or decrement in a similar fashion (triangle type).

In the example of FIG. 1, the MCU 100 programs target frequency steps into the PLLWG 110. These steps are adjusted during operation to the type of communications waveform required for each target. For example, for a first target, the steps can be 2.0 MHz apart, with an initial lowest value at 2404.0 MHz and a final highest value at 2472.0 MHz. For a second target, the steps can be 1.7 MHz apart, with an initial lowest value at 2403.5 MHz and a final highest value of 2471.5 MHz. Many different step programs can be stored inside memory accessed by the MCU 100 and programmed into the PLLWG 110 during operation to change the stepping patterns used during any one period of engagement with one or more communication targets as appropriate.

When the PLLWG 110 is triggered to reach an inflection point of each ramp of steps (e.g., the apex or nadir of each triangle ramp, or the apex of each sawtooth ramp), the PLLWG 110 sends a ramp notification signal 116 back to the MCU 100 as digital feedback regarding channel selection. This digital feedback provides the MCU 100 with the information that the ramp is complete, and the PLLWG 110 will be moving on to the next stage of its programmed ramp. This allows the MCU 100 to stay informed of channel center frequency status, so that a single error in output frequency due to an errant software command, bug, noise, electrical discontinuity, etc., will be detected and can be cleared within the period of time it takes for a single ramp to complete.

In the example of FIG. 1, the MCU 100 generates each trigger command signal 105 to not only begin the transmission and locking of the first step of a plurality of frequency target values, but to trigger the incrementing of movement to the next step. When used in this fashion, the example apparatus 50 of FIG. 1 locks frequency and phase between steps of RF center frequencies in a time period of between 0.4 µsec and 0.7 µsec for the 2.0 MHz step pattern described above. Other component combinations can readily change frequencies as they step for this and/or other step patterns in time periods of between 10 nsec and 10 µsec, representing orders of magnitude improvement in frequency switching and lock times compared to typical communications systems not employing the presently disclosed embodiment(s).

The embodiment(s) of the apparatus 50 further provides an ability to advance frequency steps in a non-sequential manner, a characteristic that no other typical PLLWG circuit is able to do. In the example apparatus 50 of FIG. 1, the trigger command signal 105 can be used in rapid succession, so that the frequency increments a plurality of steps instead of merely a single step. This succession may be performed up to the communication speed of the PLLWG 110, which in this example is 50 nsec for each step taken or skipped. This permits for capabilities that include being able to increment multiple steps to achieve a new RF channel center frequency close to a presently locked frequency in a very short time period and being able to skip various channels during each "pass" of a step pattern to provide both the appearance and effect of having a pseudo-random channel hopping sequence. The timing for implementing these capabilities is provided for in FIGS. 2A and 2C, discussed in detail below.

Figure 2A:
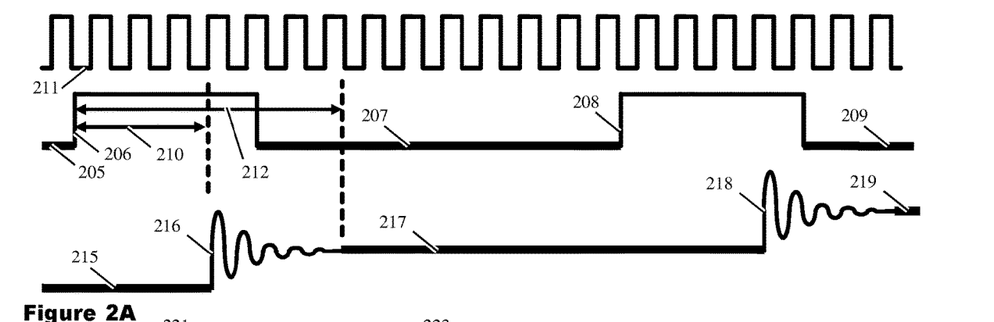
FIGS. 2A-2C illustrate an example timing diagram for the apparatus shown in FIG. 1, an example timing diagram of a typical PLL and VCO apparatus, and another example timing diagram for the apparatus shown in FIG. 1, respectively, in accordance with at least one embodiment disclosed herein.

FIG. 2A illustrates a timing diagram for the PLLWG 110 incrementing frequency steps as used in conjunction with the RF VCO 130 of the apparatus 50 shown in FIG. 1, and the resultant amplified RF channel frequency signal 135 of the RF VCO 130 as a channel center frequency. FIG. 2A illustrates a timing diagram for the apparatus 50 shown in FIG. 1, without the upconverting QM mixer 160 or the QM DAC 150 components and outputs for the sake of brevity and clarity.

In a similar manner as the example embodiment(s) of FIG. 1 employing the PLLWG timing signal 111, FIG. 2A shows a PLLWG timer signal 211 used for timing the PLLWG 110, the PLLWG timer signal 211 being an example of the PLLWG timing signal 111. The y-axis of this signal represents voltage, with in at least one embodiment a voltage "low" condition being approximately 0.1 V and a voltage "high" condition being approximately 1.7 V. The x-axis of this signal represents time, with in at least one embodiment a periodicity in the clock signal of 5 nsec in its low state followed by 4 nsec in its high state. In another embodiment(s), other physical and electrical characteristics of timing resources can be used, with other voltage levels typically used between −50 V and +50 V for relative signal conditions, and other periodicity between 0.01 nsec and 10 msec representing a wide range of clocks and timing circuitry used for various embodiments and systems utilizing that embodiment(s) by those skilled in the art of electronics design.

In FIG. 2A, the PLLWG 110, the RF VCO 130, and other hardware components have already been programmed with waveform information, have already been powered up, with the stepped-ramp waveform already having begun and the trigger command start signal 205 held low. As with the PLLWG timer signal 211, the y-axis of the trigger signal represents voltage, with a voltage low being approximately 0.1 V and a voltage high being approximately 1.7 V. The x-axis of this signal represents time as measured by the PLLWG timer signal 211 above. As with the PLL timer signal 211, in at least one other embodiment, other physical and electrical characteristics of the trigger command signals may be selected by those skilled in the art of electronics design.

The x-axis represents time as measured by the PLLWG timer signal 211 above; as of the time at the start of the graph, the circuit represented by the PLLWG timer signal 211 has already stabilized its generated output, a first stable center frequency 215 being an example of the resultant amplified RF channel frequency signal 135. The y-axis of the center frequency graph in the timing diagram represents frequency, with in at least one embodiment the lowest frequency of the first stable center frequency 215 being approximately 2404.000 MHz and held to a tight tolerance within +/−0.001 MHz across permissible system operating conditions (e.g., power level, temperature, etc.). Each of the stable designated steps shown in the center frequency graph represents an incremental increase in center frequency of +2.000 MHz per step. As with other signals, in at least one other embodiment, other physical and electrical characteristics of the center frequency output may be selected by those skilled in the art of electronics design and will be most highly dependent on the particular VCO selected for use.

When the controlling processor, e.g., the MCU 100, determines it is desirable to step from a first stable center frequency 215 to a second stable center frequency 217, a trigger first start signal 206 is applied. A trigger timing delay signal 210 represents the time and number of clock cycles that must pass before the PLLWG 110 responds to the trigger first start signal 206. The delay in the example of FIG. 2A is 28 nsec. When the PLLWG 110 responds, the RF VCO 130 begins to adjust the output upwards in frequency, as shown, by the rapid initial ramp of the first step transition frequency 216.

The first step transition frequency 216 illustrated in FIG. 2A is shown to rapidly rise to and surpass the target frequency of the second stable center frequency 217. The PLL circuitry discussed above in FIG. 1 detects this overshoot and reduces the applied tuning signal in response. The first step transition frequency 216 is then seen to return towards the target frequency of the second stable center frequency 217 and surpass it in the downwards direction. This process of overshoot, compensate, return then settles down to a frequency locked state where the output matches the second stable center frequency 217. Once the frequency is locked and correct, the PLL circuitry discussed above then further attempts to lock phase, which is not shown in FIG. 2A.

The time required to achieve frequency lock once the PLL circuitry is engaged for the example of FIG. 2A is 36 nsec. Combined with the 28 nsec of trigger timing delay 210 for the control command, the total shift time 212 to adjust frequency and achieve lock required 56 nsec. It is recognized that this time period for frequency lock appears rapid, but the frequency shift is less than 0.1% (2.000 MHz out of 2404.000 MHz) and rapid shifts of small frequency changes are possible with the PLLWG 110 in operation in ramp waveform mode. Once the PLL circuitry was engaged after the first clock high of the trigger timing delay 210, the trigger first start signal 206 is removed and the second trigger command low signal 207 is sent by the MCU 100.

It is contemplated that a wide range of speeds of frequency lock may be accomplished according to the presently disclosed embodiment(s) using a wide variety of processor, PLLWG, and VCO combinations. Some combinations having high communication data rates, short processing lag, no phase locking requirement, and small frequency steps, in at least one embodiment of as little as one part per million frequency change might lock in as little as 0.1 nsec. Other combinations with slower communication data rates, long processing lag, tight phase locking, and large frequency steps, in at least one embodiment over 50% percent frequency change can lock in 30 μsec. Longer lock times of greater than 30 μsec are possible, but not typically of interest to those pursuing application of the presently disclosed embodiment(s).

It is recognized that the oscillation, or "ringing," of the frequency output upon engagement of the PLL circuitry discussed above will occur in some instantiations of the presently disclosed embodiment(s). In at least one of these embodiments, such oscillations may occur with a substantially greater magnitude and duration than illustrated in the example of FIG. 2A. Such oscillations will be responsible for longer lock times, although other PLL circuitry characteristics, such as stability and immunity to noise, temperature, and other operating conditions, may be had in such embodiment(s). In at least one of these embodiments under different operating conditions, the frequency output will not overshoot and/or oscillate and will instead approach the new target frequency with a time delay and other electrical characteristics appropriate for the specific combination of hardware and software. In other embodiment(s), it is contemplated that the frequency output may never oscillate under any operating conditions permitted by its specific combination of hardware, software, and operating conditions.

It is further recognized that in certain systems, according to the presently disclosed embodiment(s), that do not have an integrating operational amplifier circuit, or that have a low level of integration in their amplifier circuit, may not be able to lock phase with the second stable center frequency 217. It is further recognized that certain applications, such as one-way radio data transmission, radio jamming, radio data link disruption, data link bit error rate enhancement, and other communications and electronic warfare applications do not necessarily require phase locking and associated components.

The activity of the timing diagram for FIG. 2A repeats in time to illustrate the nature of channel center frequency stepping and interaction with the control signals. In the same manner as the trigger first start signal 206 was sent after the trigger command start signal 205, a trigger second high signal 208 is sent by the MCU 100 to replace the second trigger command low signal 207, followed by a third trigger command low signal 209. As before, a trigger timing delay 210 occurs before the PLL circuitry discussed above is engaged to step to a new target of the third stable center frequency 219. A similar frequency oscillation occurs until the frequency is locked by this PLL circuitry.

Figure 2B:
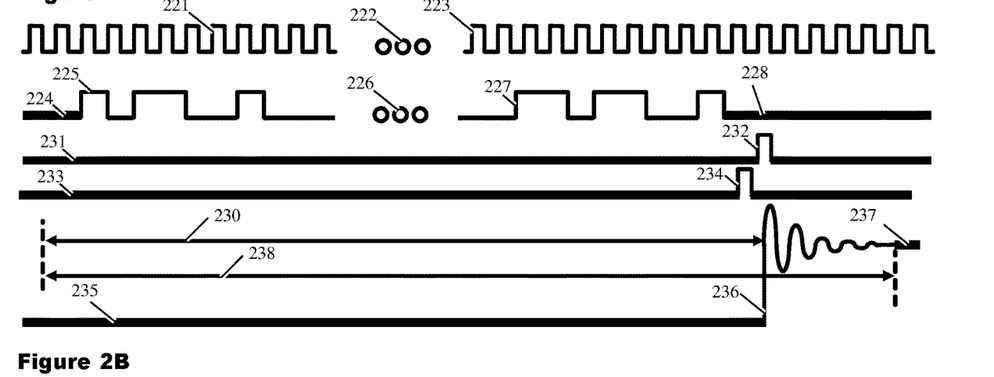

FIG. 2B illustrates the operation and timing diagram of a typical PLL+VCO circuit used in the radio communications industry as a matter of contrast, providing elucidation as to the merits of certain aspects of the presently disclosed embodiment(s). FIG. 2B illustrates the timing of clock and MCU control signals provided to a PLL driving a VCO and its resultant frequency output for use as a channel center frequency. In a similar manner as the PLLWG timer signal 211 in FIG. 2A, FIG. 2B shows a PLL timer signal 221. As with the PLLWG timer signal 211, the y-axis of the PLL timer signal 221 represents voltage, with an example including a voltage low being approximately 0.1 V and a voltage high being approximately 1.7 V. Similarly, the x-axis of this signal represents time, with an example including a periodicity in the clock signal of 4 nsec in its low state followed by 4 nsec in its high state. It is similarly contemplated that in other instantiations of the presently described subject matter, other physical and electrical characteristics of timing resources may be used with characteristics previously described, representing a wide range of timing circuitry used by those skilled in the art of electronics design.

In FIG. 2B, the PLL, VCO, and other hardware have already been programmed with waveform information, have already been powered up, with the RF output signal already being locked, and the data input start signal 224, trigger PLL hold signal 231, and data activity start signal 233 held low. The y-axis of these signals represent voltage, with an example including a voltage low being approximately 0.1 V and a voltage high being approximately 1.7 V. The x-axis of this signal represents time as measured by the PLL timer signal 221. As with previously described command signals, it is contemplated that in other instantiations of the presently described subject matter, other physical and electrical characteristics of the data and command signals may be appropriately selected and implemented by those skilled in the art of electronics design.

As of the time designating the start of FIG. 2B, the circuit represented by the signal shown in FIG. 2B has already stabilized its generated output, a first PLL center frequency 235. The y-axis of the center frequency graph in the timing diagram represents frequency, with an example including the lowest frequency of the first stable center frequency 235 being, e.g., approximately 431.7647 MHz and held to a tight tolerance within +/−0.3 kHz across permissible system operating conditions (e.g., power level, temperature, etc.). Each of the stable designated steps shown in the center frequency graph represents an incremental increase in center frequency of, e.g., +50.0 kHz per step.

When the controlling microprocessor determines it is desirable to step from a first PLL center frequency 235 to a second PLL center frequency 237, it ensures a logic low is sent to a load enable 234 pin. This informs the PLL that data and triggering signal information is being sent to it, so it must enter any and all data provided into its input shift register and endeavor to follow applied commands. At least one clock cycle after the load enable 234 is applied low, a serial stream of data is provided by the MCU 100 to the PLL circuitry. This frequency data start signal 225 is applied to the input data line as a series of highs and lows, with the example of FIG. 2B being 1, 0, 1, 1, 0, 0, 1, 0, 0, as illustrated.

The clock and frequency selection data items continue to be applied over a period of time while the load enable signal 234 is held low and the trigger PLL hold signal 231 is held low. No activity occurs in the frequency domain during this data transfer, as seen by the flat first PLL center frequency 235 throughout most of the time presented in FIG. 2B. The passage of time continues longer than can be shown in FIG. 2B, with continuing clock cycles 222 representing this passage of measured time and the continuing data stream 226 representing the passage of data highs and lows until the final timing events occur. The transmission of data is completed during the PLL timer continuation signal 223 and the frequency data finish signal 227. The total number of clock cycles for the transmission of one data set for the example of FIG. 2B is in an example 1 cycle for the load enable signal 234 plus 32 cycles for the transmission of data for the minimum delivery of a 12-bit word defining the location of a new frequency target. Under typical operation, this transmission is in an example 1 cycle for the load enable signal 234 plus 64 cycles for a normal word defining the desired frequency. These values are typical for PLLs used in radio communications systems, which may require up to 256 cycles to provide the data required to define the desired new target frequency.

After the data transmission is complete, the MCU 100 pulls the data complete low signal 228 and one or more clock cycles later, pulls the load enable signal 234 data line high. Once this is pulled high, the input shift register is loaded into one of the eight latches as selected by control bits, providing the data defining a new target frequency. The PLL circuitry is now programmed and ready to move to this new frequency upon command from the MCU 100. If desired, prior to engaging the new step, the MCU 100 can make a request to repeat back the newly programmed target frequency information, which in an example would require an absolute minimum of 37 clock cycles if the minimum coarse steps were used, to a more typical response time of 69 cycles assuming high precision is required.

The MCU 100 applies a trigger PLL start signal 232 to the PLL circuitry to initiate the frequency change. In this case, there is no appreciable additional trigger timing delay signal 210 as seen in the example of FIG. 2A, and the VCO output immediately (i.e., without appreciable asynchronous or clock-based delay) begins a rapid ramp upwards towards with a PLL step transition signal 236. However, the total time elapsed between the start of the MCU 100 initiating a frequency change to the time that the VCO begins to change its output frequency is the PLL data delay 230. In the typical case without requesting a read-back of transmitted frequency data uploaded to the PLL, this delay would be 66 cycles. At 8 nsec per cycle, this is 512 nsec.

In the example of FIG. 2B, the oscillation of the VCO moving from the PLL step transition 236 to the second PLL center frequency 237 takes approximately 6 clock cycles to lock in frequency. The total amount of time total shift time 212 to adjust frequency and achieve lock required 56 nsec, therefore, to proceed from the first PLL center frequency 235 to the second PLL center frequency 237 is the total shifting time 238 to adjust frequency and achieve lock in 72 clock cycles, or about 576 nsec. While still extremely fast, this technique of changing center frequency takes nine times as long to accomplish and requires flawless communication to occur between the MCU and the PLL. With a single erroneous bit, the frequency change will fail to achieve its target, resulting in transmission on a different channel than intended which may be illegal or ineffective depending on the application and the nature of the error. Reducing operational risk with read-back, however, effectively doubles the operational delay. In typical radio communications applications, a few additional microseconds are not a problem, but for certain electronic warfare and other specialty applications, this timing difference may be critical.

Figure 2C:
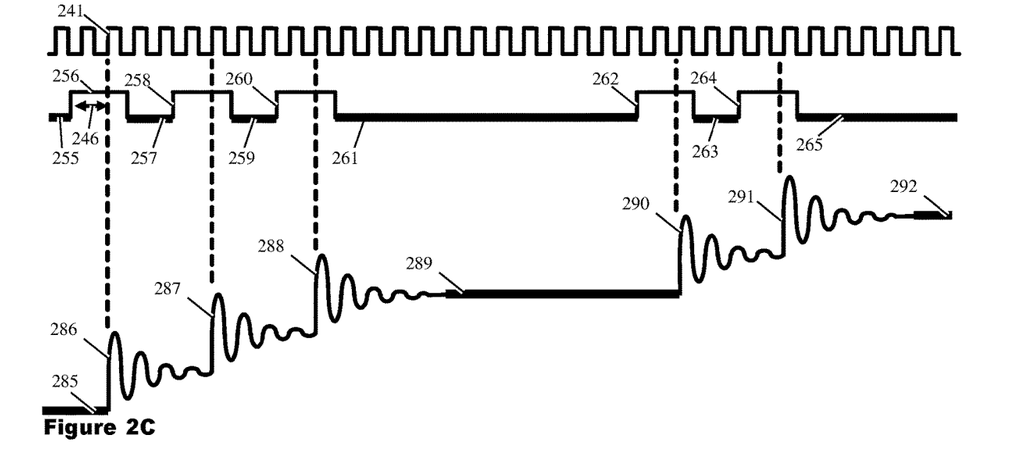

The example timing diagram of the PLLWG 110 of FIG. 2C illustrates its capability to increment multiple steps to achieve a new RF channel center frequency close to a presently locked frequency in a very short time period. FIG. 2C also illustrates the capability of skipping various channels during each "pass" of a step pattern to provide both the appearance and effect of having a pseudo-random channel hopping sequence. The hardware supporting the signals of FIG. 2C can be similar to that used in the example of FIG. 2A, except with a higher frequency VCO and longer oscillation settling time.

In a similar manner as the example of FIG. 2A employing a PLLWG timer signal 211, FIG. 2C shows a PLLWG timed signal 241 used for timing the PLLWG 110. The y-axis of this signal represents voltage, with high and low voltage levels essentially equivalent to those described for FIG. 2A. The x-axis represents time, also with an example period of 8 nsec. It is similarly contemplated that in other embodiments, other physical and electrical characteristics of timing resources may be used with characteristics previously described, representing a wide range of timing circuitry used by those skilled in the art of electronics design.

In FIG. 2C, the PLLWG 110, the RF VCO 130, and other hardware have already been programmed with waveform information, have already been powered up, with the stepped-ramp waveform already having begun with the RF output signal already being locked and the trigger step start signal 255 held low. As with the PLLWG timer signal 211, the y-axis of the trigger signal represents voltage, and the x-axis of this signal represents time in an equivalent fashion as the example of FIG. 2A. As with other timing resource and command signals previously described, it is contemplated that in other embodiments of the presently described subject matter, other physical and electrical characteristics may be selected by those skilled in the art of electronics design.

As of the start time of FIG. 2C, the example apparatus 50 has already stabilized its generated output, a first step center frequency 285. The y-axis has a lowest frequency of the first step center frequency 285 being in an example approximately 5707.02 MHz and held to a tight tolerance within +/−3 kHz across permissible system operating conditions (e.g., power level, temperature, etc.). Each of the stable designated steps shown in the center frequency graph represents an incremental increase in frequency of, e.g., +2.30 MHz per step.

In the example of FIG. 2C, the MCU 100 determines it is desirable to step from the first step center frequency 285 to the fourth stable center frequency 289, skipping over the second and third steps. Such an example application may be to jump from Channel 1 of a target receiver's channel set to Channel 4 in order to match channel hops made by a transmitter operating in a synchronous manner with the target receiver. In the application example of FIG. 2C, this needs to be performed in less than half a microsecond and would therefore be impossible using the techniques described in the example of FIG. 2B.

The MCU 100 initiates the process by applying a trigger first step 256. The trigger input settings of the PLLWG 110 are such that the trigger time delay 246 is short before the PLLWG 110 responds by sending its VCO control signals to adjust the output upwards in frequency. The delay in the example of FIG. 2C is 12 nsec. The rapid initial ramp of the first step transition 286 is seen to begin in a similar manner as with previous examples of FIGS. 2A and 2B. After the first step transition 286 begins, the MCU 100 applies a trigger second low signal 257. This low is read by the PLLWG 110 so that it is ready for the next trigger pulse within a few clock cycles. Meanwhile, the first step transition 286 is starting to settle, but frequency lock has not yet been achieved by the time the MCU 100 applies its next step command, a trigger second step 258.

As with the response to the trigger first step 256, the PLLWG 110 has a trigger time delay 246 before the RF VCO 130 again responds to the new command, increasing its target frequency by one additional step. The output response becomes the second step transition 287 as the RF VCO 130 increases frequency towards the third step in the pre-programmed set of frequency steps. As before, once this process is underway, the MCU 100 applies a trigger third low signal 259 and the PLLWG 110 is again reset ready for new trigger command signals. Again, as before after a few clock cycles, the MCU 100 applies another step command, a trigger third step 260. After a short trigger time delay 246, the RF VCO 130 increases upwards with a third step transition 288 towards the fourth step. The MCU 100 applies a trigger fourth low signal 261 and waits for the frequency to settle. After some time, the oscillations of the third step transition 288 decay and the apparatus 50 has achieved a frequency lock on the fourth stable center frequency 289.

In the example of FIG. 2C, the total length of time required to proceed from the decision to leave the first stable center frequency 285 and finally achieve the fourth stable center frequency 289 was 116 nsec. While substantially longer than the time required for the example of FIG. 2A to achieve a single step in frequency (56 nsec), it is far shorter than the time required for three individual steps (~200 nsec). By extrapolation of the time for each step, it can be reasonably calculated that approximately six steps can be taken in the same amount of time as three steps would otherwise take.

The example of FIG. 2C continues with a second sequence wherein the desired center channel frequency signal output is to increase by two steps to see the incremental overhead and time savings per step. The MCU 100 applies a trigger fourth step 262, initiating the delay as before until the rapid initial ramp of the fourth step transition 290. As before, the MCU 100 then applies a trigger fifth low signal 263 so the PLLWG 110 is ready for the next trigger pulse. Meanwhile, the fourth step transition 290 is starting to settle as the MCU 100 applies its next step command, a trigger fifth step 264. The output response becomes the fifth step transition 291 as the RF VCO 130 increases frequency towards the sixth step in the sequence. The MCU 100 then applies a trigger sixth low signal 265 and, after some period of time, the oscillations of the fifth step transition 291 decay and the apparatus 50 has achieved a frequency lock on the sixth stable center frequency 292. The total length of time required to proceed from the decision to leave the fourth stable center frequency 289 and achieve a frequency lock on the sixth stable center frequency 292 was 84 nsec, a period of time not much longer than the example of FIG. 2A took to achieve a single step.

The example of FIG. 2C provides a means for a partially randomized order of center channel frequencies when one extends the operation of the channel stepping all the way through multiple passes of the available channels with varying numbers of steps and by varying which steps is taken during each pass. Every channel can be transmitted twice after seven total passes through the available steps, for example, by predictively selecting channels and how many times the trigger command signals are executed between each transmission. Each new channel would skip two, three, four, or five channels between hops, providing a continuously moving, though typically piecewise monotonic, selection of which channel is in use during any given period. Such a capability is useful for emulating slower radio pseudo-random channel selection at a vastly increased rate of channel selection speed. Pseudo-random channel selection is useful for meeting emissions requirements for certain deployments, as well as for reducing the probability of intercept and/or detection as an electronic warfare or other non-public emission.

It is recognized that in other embodiments, the original data content may be provided by a separate digital source (not shown) such as a direct digital synthesizer that can send both in-phase and quadrature data as two direct outputs. It is further recognized that in other embodiments, the original data content may be sent by a microprocessor or the MCU 100 to DACs in a highly parallel fashion and converted to analog signals in real-time. This permits the dynamic adjustment of microprocessor data to be generated, conditioned, and transmitted adaptively during operation without being limited by the memory capacity of the QM DAC 150.

The upconverting QM mixer 160 takes an incoming RF carrier wave and mixes this with a high-speed baseband signal or intermediate RF signal to create a frequency modulated waveform. In the example of FIG. 1, the RF carrier wave is the pre-QM RF channel frequency signal 145 being modulated by the data contained in the in-phase modulation signal 155 and the QM signal 156. As the upconverting QM mixer 160 provides for mixing both in-phase and quadrature content (IQ mixing), then the full range of frequency, phase, and amplitude modulation techniques are available to those skilled in the art.

The steps of upconverting IQ data inside the upconverting QM mixer 160 is a complex procedure known to those skilled in the art of RF electronics design and is beyond the scope of discussion in the presently disclosed embodiment(s). It is accepted by those skilled in the art that the modulated RF output signal 165 of upconversion is a waveform centered on the same frequency as the pre-QM RF channel frequency signal 145, but containing frequency, phase, and amplitude data content defined by the in-phase and quadrature data signals. The primary advantage of such a modulation circuit is that a wide variety of modulation techniques can be used to encode data, and therefore it can be used to replicate old-fashioned, modern, and possibly future types of waveforms. The QM mixer 160 is agnostic to its inputs to the limits of its precision across the frequency range of its use, and these inputs can even be pre-tuned in an open-loop or closed-loop fashion to address non-linearities or frequency-dependent characteristics such as carrier-output isolation. Any type of waveform can be generated up to the bandwidth and precision limits of the components selected and operating conditions applied by those skilled in the art.

Figure 3:
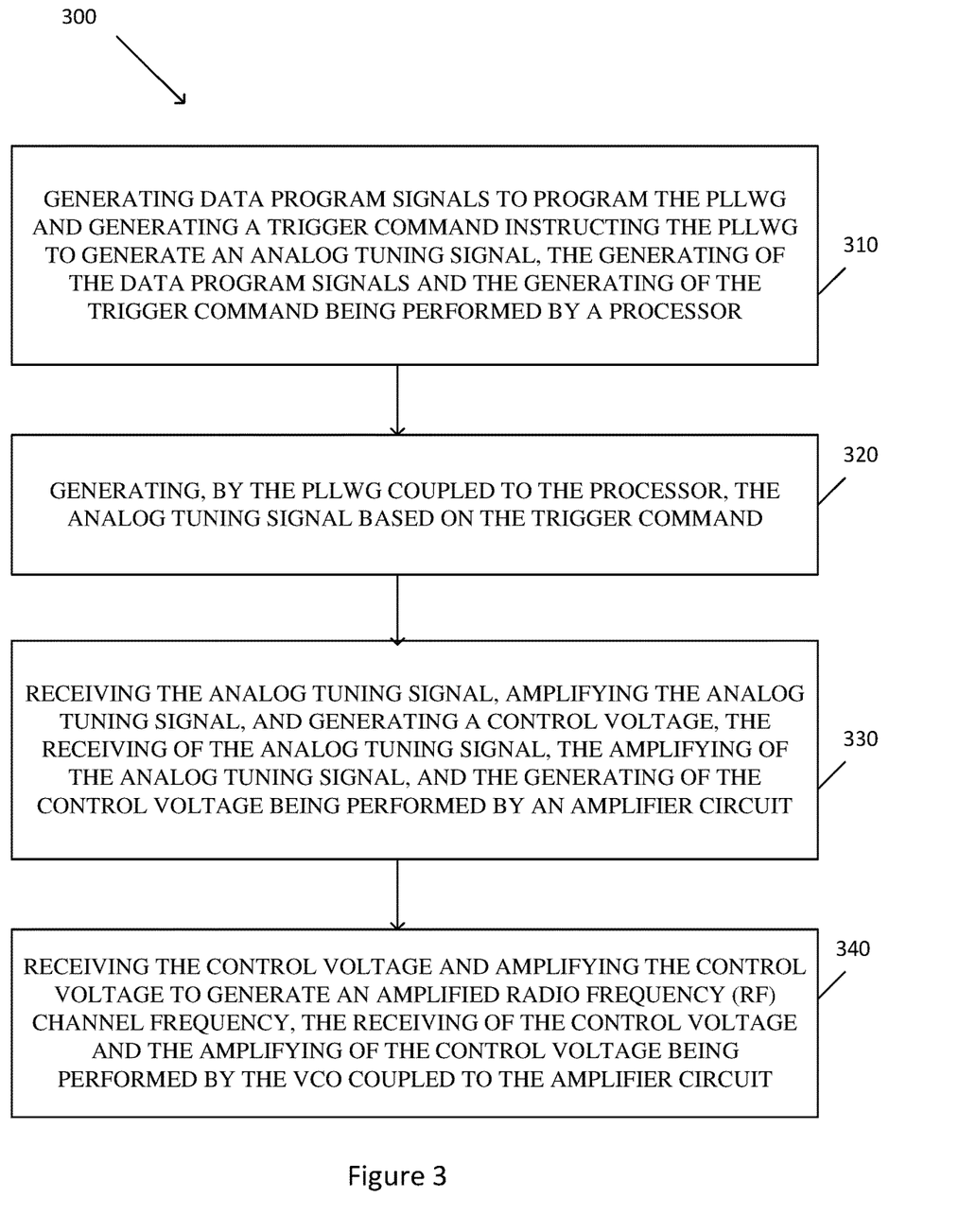
FIG. 3 illustrates an example method for generating the amplified radio frequency channel frequency signal, in accordance with at least one embodiment disclosed herein.

FIG. 3 illustrates a method 300 including a process 310 generating the program data signals 107 to program the PLLWG 110 and generating a trigger command signal 105 instructing the PLLWG 110 to generate the analog tuning signal 112. In at least one embodiment, these generations are performed by a processor, such as the MCU 100. Process 310 proceeds to process 320.

Process 320 includes generating the analog tuning signal 112 based on the trigger command signal 105. In at least one embodiment, this generating the analog tuning signal 112 is performed by the PLLWG 110 coupled to the MCU 100. Process 320 proceeds to process 330.

Process 330 includes receiving the analog tuning signal 112, amplifying the analog tuning signal 112, and generating the precise control voltage signal 125. In at least one embodiment, the receiving of the analog tuning signal 112, the amplifying of the analog tuning signal 112, and the generating of the precise control voltage signal 125 are performed by the amplifier circuit 60. Process 330 proceeds to process 340.

Process 340 includes receiving the precise control voltage signal 125 and amplifying the precise control voltage signal 125 to generate the amplified RF channel frequency signal 135, the receiving of the precise control voltage signal 125 and the amplifying of the precise control voltage signal 125 being performed by the VCO 130 coupled to the amplifier circuit 60. The method 300 can further include any of the processes and any of the components of the apparatus 50 described above for FIG. 1.

Thus, embodiment(s) of the method 300 (FIG. 3) and apparatus 50 disclosed herein enable a low-cost, low-complexity, low-power apparatus 50 that generates a modulated waveform and is able to switch center frequencies of transmission at a high rate of speed. Quadrature Amplitude Modulation (QAM) permits amplitude, frequency, and phase shift-keyed data encoded on a carrier wave in a manner that may be decoded by a receiver (not shown) or used to increase Bit Error Rates (BERs) of unsynchronized receivers (not shown) operating in the same channels. The embodiment(s) use low-complexity command signals for both data and channel selection at high rates of speed compared to the those of typical low-cost communication systems used and/or developed by those skilled in the art.

The embodiment(s) of the method 300 and apparatus 50 disclosed herein allow for generation and/or emulation of differently modulated waveforms in a fast-switching time-division-duplexed manner. Further embodiment(s) allow for pseudo-random center frequency channel hopping, a requirement for enabling or emulating many commercial, industrial, and military waveforms as well as for meeting certain regulatory requirements. The disclosed embodiment(s) are scalable and software-adaptable to reconfigure multi-bit modulation options quickly and inexpensively in either a development environment as well as in production, sustainment, and future system compatibility of products incorporating the presently disclosed subject matter.

The embodiment(s) of the method 300 and apparatus 50 disclosed herein solve problem(s) within the art by implementing a pair of complementary circuit and control command techniques. The PLLWG 110 drives the channel selection RF 130 VCO instead of using a traditional PLL. The output of the RF VCO 130 is then modulated by data that is originally digitally generated, but then converted to analog by the QM DAC 150 and sent to a modulator, such as the upconverting QM mixer 160. This approach reduces the overall size, weight, power consumption, and time-to-market of competing approaches that use full-digital waveform synthesis, and provides a faster response time to adapt or change frequencies in response to external asynchronous and/or unpredictable stimuli (e.g., following a fast channel-hopping target).

The embodiment(s) of the method 300 and apparatus 50 disclosed herein are comprised of hardware circuit configurations providing a set of digital general purpose (or high speed) input/output pins of a controller, such as the MCU 100, to interact with the data input pins of the PLLWG 110. Communications systems have not previously incorporated a waveform generator. Further comprising these hardware circuit configurations, the output of the PLLWG 110 then interacts with the voltage control pin of an amplifier, such as the upconverting QM mixer 160, used otherwise to nominally drive the tuning voltage of (and adjusts the center frequency of) the RF VCO 130.

In certain embodiment(s), this output from the PLLWG 110 is provided amplification and integration through an active filter circuit (not shown) before being supplied to the voltage control pin. In such embodiments, the time to lock the frequency is longer than without such an active filter/integration circuit, but the PLLWG 110 will be able to lock in phase. Phase locking is critical for matched data transmission/reception applications having advanced QAM-type modulation. In at least one other embodiment, the output from the PLLWG 110 is sent directly to the voltage control pin with or without passive (rather than active) signal conditioning. In such embodiment(s), the time to lock frequency is shorter, but the PLLWG 110 will not be able to lock phase. Such embodiment(s) may be desirable for certain one-way transmission, waveform emulation, and/or electronic warfare applications, as the circuit complexity is further reduced for cost, size, power savings, and speed of frequency lock due to the elimination of the "integration step" of the feedback control loop.

The advantage of using the PLLWG 110 disclosed herein instead of a typical PLL as with other communications systems is that the waveform generator portion of the PLLWG 110 has a pre-defined set of center frequencies that it can be advanced to, and it is capable of significantly faster frequency and/or phase locks. A typical PLLWG, for example, can increment a frequency step between 0.1 and 10 μsec. A typical "fast-locking" PLL, by contrast, changes center frequency VCO output in a time span of between 10 and 10,000 μsec depending on the circuit configuration, as indicated by vendors in the market with devices capable of 10 to 10,000 µsec lock times.

In at least one embodiment, a single set of PLLWGs (not shown) with their VCOs (not shown) can be used for each intended transmission band. When a specific channel center is required, a sequence of digital pulses is supplied by the driving MCU to the input data line of the PLLWG a plurality of times equal to the desired channel number. This can be accomplished at a high rate of speed limited only by the communications rate of the PLLWG and driving MCU. In at least one embodiment, such communication rates may permit incrementing the desired channel steps, such as every 10 to 500 nsec. For nearby channels (e.g., one to five steps away, which may be a few MHz away), such increment timing could still result in sub-µsec channel lock, but for far channels (e.g., tens of steps away, which may be tens of MHz away), this technique may not be ideal for meeting channel switching times for a particular application.

In at least one embodiment, the method 300 and apparatus 50 disclosed herein provide for channel hopping to patterns of channels that have been pre-determined by a system developer and pre-programmed into the MCU 100. These channel hopping patterns can be implemented to appear to be random or pseudo-randomly selected. The modulation technique, waveform, and/or data can be changed during and/or between the transmission of each channel hop. In at least one embodiment, this technique is specifically known to be valuable for causing increased BER in both radio-controlled protocols (requiring higher power levels and extended transmission time per channel) as well as Wi-Fi based protocols (requiring rapid modulation per channel).

The foregoing description merely explains and illustrates the disclosure and the disclosure is not limited thereto except insofar as the appended claims are so limited, as those skilled in the art who have the disclosure before them will be able to make modifications without departing from the scope of the disclosure.

What is claimed is:

1. An apparatus, comprising:
   a processor to generate data program signals to program a Phase-Locked Loop Waveform Generator (PLLWG) and generate a trigger command signal instructing the PLLWG to generate an analog tuning signal;
   the PLLWG, coupled to the processor, to generate the analog tuning signal based on the trigger command signal;
   an amplifier circuit, coupled to the PLLWG, to receive the analog tuning signal, amplify the analog tuning signal and generate a control voltage;
   a Voltage Controlled Oscillator (VCO), coupled to the amplifier circuit, to receive the control voltage and amplify the control voltage to generate an amplified Radio Frequency (RF) channel frequency signal;
   a Digital-to-Analog Converter (DAC), wherein the processor further generates a data command which instructs the DAC to generate an in-phase modulation signal and a Quadrature Modulation (QM) signal; and
   an upconverting QM mixer to receive the in-phase modulation signal, the QM signal, and the amplified RF channel frequency signal, and generate a modulated RF output based on the in-phase modulation signal, the QM signal, and the amplified RF channel frequency signal.

2. The apparatus according to claim 1, wherein the amplifier circuit is comprised of an amplifier, a first voltage divider resistor, and a second voltage divider resistor, the first voltage divider resistor and the second voltage divider resistor generating an amplifier voltage reference for input to the amplifier.

3. The apparatus according to claim 1, further comprising a conditioning circuit coupled to both the PLLWG and the amplifier circuit, the conditioning circuit comprised of a capacitor and a resistor, one side of the capacitor being coupled to one side of the resistor and the PLLWG, and the other side of the capacitor being coupled to electrical ground and the other side of the resistor being coupled to the amplifier circuit.

4. The apparatus according to claim 1, wherein the amplifier circuit includes a buffering integrated amplifier, the apparatus further comprising a tuning feedback circuit to feedback the control voltage to the buffering integrated amplifier.

5. The apparatus according to claim 1, wherein the processor is one of an NXP LPC43S50 with a system clock of 204 MHz and capable of Serial General Purpose Input Output (SGPIO) bit-shifting speeds of up to 102 MHz, and a Field-Programmable Gate Array (FPGA), and System-On-a-Chip (SOC).

6. The apparatus according to claim 1, further comprising an RF power splitter to transform the amplified RF channel frequency signal into two RF signals each having approximately half of a power of the amplified RF channel frequency signal.

7. The apparatus according to claim 1, wherein the VCO includes an oscillator element and a VCO amplifier, the oscillator element to receive the control voltage and generate an initial RF channel frequency signal of a frequency determined by a voltage level of the control voltage and the VCO amplifier to amplify the initial RF channel frequency signal and output the amplified RF channel frequency signal.

8. An apparatus, comprising:
   a processor to generate data program signals to program a Phase-Locked Loop Waveform Generator (PLLWG) and generate a trigger command signal instructing the PLLWG to generate an analog tuning signal;
   the PLLWG, coupled to the processor, to generate the analog tuning signal based on the trigger command signal;
   an amplifier circuit, coupled to the PLLWG, to receive the analog tuning signal, amplify the analog tuning signal and generate a control voltage;
   a Voltage Controlled Oscillator (VCO), coupled to the amplifier circuit, to receive the control voltage and amplify the control voltage to generate an amplified Radio Frequency (RF) channel frequency signal
   wherein the PLLWG is comprised of a Phase Frequency Detector (PFD) circuit to measure a feedback of the VCO to determine whether the analog tuning signal needs to be one of raised and lowered, and includes an estimate of by how much to one of raise and lower the analog tuning signal;
   wherein a timing resource is comprised of first and second Asynchronous Clock Generators (ACGs), the first ACG to generate a processor timing signal for the processor and the second ACG to generate a PLLWG timing signal for the PLLWG.

9. A method, comprising:
   generating data program signals to program a Phase-Locked Loop Waveform Generator (PLLWG) and generating a trigger command signal instructing the PLLWG to generate an analog tuning signal, the generating of the data communication signals and the generating of the trigger command signal being performed by a processor;

generating, by the PLLWG coupled to the processor, the analog tuning signal based on the trigger command signal;

receiving the analog tuning signal, amplifying the analog tuning signal, and generating a control voltage, the receiving of the analog tuning signal, the amplifying of the analog tuning signal, and the generating the control voltage being performed by an amplifier circuit; and receiving the control voltage and amplifying the control voltage to generate an amplified Radio Frequency (RF) channel frequency signal, the receiving of the control voltage and the amplifying of the control voltage being performed by a Voltage Controlled Oscillator (VCO) coupled to the amplifier circuit;

generating, by the processor, a data command which instructs a Digital-to-Analog Converter (DAC) to generate an in-phase modulation signal and a QM signal; and receiving, by an upconverting QM mixer, the in-phase modulation signal, the QM signal, and the amplified RF channel frequency signal; and generating, by the upconverting QM mixer, a modulated radio frequency output based on the in-phase modulation signal, the QM signal, and the amplified RF channel frequency signal.

10. The method according to claim 9, wherein the amplifier circuit is comprised of an amplifier, a first voltage divider resistor, and a second voltage divider resistor, the method further comprising generating, by the first voltage divider resistor and the second voltage divider resistor, an amplifier voltage reference for input to the amplifier.

11. The method according to claim 9, further comprising coupling a conditioning circuit to both the PLLWG and the amplifier circuit, the conditioning circuit comprised of a capacitor and a resistor, one side of the capacitor being coupled to one side of the resistor and the PLLWG, and the other side of the capacitor being coupled to electrical ground and the other side of the resistor being coupled to the amplifier circuit.

12. The method according to claim 9, wherein the amplifier circuit includes a buffering integrated amplifier, the method further comprising feeding back, by a tuning feedback circuit, the control voltage to the buffering integrated amplifier.

13. The method according to claim 9, wherein the processor is one of an NXP LPC43S50 with a system clock of 204 MHz and capable of synchronous Serial General Purpose Input Output (SGPIO) bit-shifting speeds of up to 102 MHz, and a Field-Programmable Gate Array (FPGA), and System-On-a-Chip (SOC).

14. The method according to claim 9, further comprising transforming, by an RF power splitter, the amplified RF channel frequency signal into two RF signals each having approximately half of a power of the amplified RF channel frequency signal.

15. The method according to claim 9, wherein the VCO includes an oscillator element and a VCO amplifier, the method further comprising:

receiving the control voltage and generating an initial RF channel frequency signal of a frequency determined by a voltage level of the control voltage, by the oscillator element; and amplifying the initial RF channel frequency signal and outputting the amplified RF channel frequency signal, by the VCO amplifier.

16. A method, comprising:

generating data program signals to program a Phase-Locked Loop Waveform Generator (PLLWG) and generating a trigger command signal instructing the PLLWG to generate an analog tuning signal, the generating of the data communication signals and the generating of the trigger command signal being performed by a processor;

generating, by the PLLWG coupled to the processor, the analog tuning signal based on the trigger command signal;

receiving the analog tuning signal, amplifying the analog tuning signal, and generating a control voltage, the receiving of the analog tuning signal, the amplifying of the analog tuning signal, and the generating the control voltage being performed by an amplifier circuit; and receiving the control voltage and amplifying the control voltage to generate an amplified Radio Frequency (RF) channel frequency signal, the receiving of the control voltage and the amplifying of the control voltage being performed by a Voltage Controlled Oscillator (VCO) coupled to the amplifier circuit;

wherein the PLLWG is comprised of a Phase Frequency Detector (PFD) circuit, the method further comprising measuring, by the PFD circuit, a feedback of the VCO to determine whether the analog tuning signal needs to be one of raised and lowered, and includes an estimate of by how much to one of raise and lower the analog tuning signal;

wherein a timing resource is comprised of first and second Asynchronous Clock Generators (ACGs), the method further comprising:

generating, by the first ACG, a processor timing signal for the processor; and generating, by the second ACG, a PLLWG timing signal for the PLLWG.

* * * * *